US012522925B2

(12) United States Patent
Woo et al.

(10) Patent No.: US 12,522,925 B2
(45) Date of Patent: Jan. 13, 2026

(54) THIN FILM DEPOSITION APPARATUS HAVING MULTI-STAGE HEATERS AND THIN FILM DEPOSITION METHOD USING THE SAME

(71) Applicant: HANWHA PRECISION MACHINERY CO., LTD., Changwon-si (KR)

(72) Inventors: Ram Woo, Seoul (KR); Sang Bo Kim, Seoul (KR); Jin Hwan Lee, Seoul (KR); Min Ho Cheon, Seoul (KR); Seung Jun Lee, Seoul (KR)

(73) Assignee: HANWHA PRECISION MACHINERY CO., LTD., Changwon-si (KR)

( * ) Notice: Subject to any disclaimer, the term of this patent is extended or adjusted under 35 U.S.C. 154(b) by 463 days.

(21) Appl. No.: 18/091,961

(22) Filed: Dec. 30, 2022

(65) Prior Publication Data

US 2023/0212751 A1 Jul. 6, 2023

(30) Foreign Application Priority Data

Dec. 31, 2021 (KR) ........................ 10-2021-0194446

(51) Int. Cl.
*C23C 16/46* (2006.01)
*C23C 16/458* (2006.01)

(52) U.S. Cl.
CPC .......... *C23C 16/46* (2013.01); *C23C 16/4586* (2013.01)

(58) Field of Classification Search
CPC .... C23C 16/4586; C23C 16/45; C23C 16/458
See application file for complete search history.

(56) References Cited

U.S. PATENT DOCUMENTS

2005/0287806 A1* 12/2005 Matsuura ................ C23C 16/36 257/E21.293
2010/0022094 A1* 1/2010 Kim .................. H01L 21/68742 414/222.01
2015/0279708 A1* 10/2015 Kobayashi ........ H01L 21/67028 438/747

FOREIGN PATENT DOCUMENTS

| | | | |
|---|---|---|---|
| JP | 8-330318 | A | 12/1996 |
| JP | 2007-189222 | A | 7/2007 |
| KR | 101362811 | B1 | 2/2014 |
| KR | 101625478 | B1 | 5/2016 |

(Continued)

OTHER PUBLICATIONS

Communication dated Jun. 12, 2024, issued by the Korean Intellectual Property Office in Korean Patent Application No. 10-2021-0194446.

(Continued)

*Primary Examiner* — Joseph A Miller, Jr.
(74) *Attorney, Agent, or Firm* — Sughrue Mion, PLLC

(57) ABSTRACT

A thin film deposition apparatus includes: a chamber configured to process a plurality of substrates; a plurality of heater members disposed to correspond to the substrates to heat the substrates, respectively; a plurality of lift pins configured to support lower surfaces of the substrates while elevating through the heater members, respectively; a plurality of heat shield plates, having a heat shield function between the heater members, on which lower ends of the lift pins are configured to be seated; and a plurality of support columns coupled with and supporting the heater members.

20 Claims, 15 Drawing Sheets

(56) References Cited

FOREIGN PATENT DOCUMENTS

| | | | |
|---|---|---|---|
| KR | 102166491 | B1 | 10/2020 |

OTHER PUBLICATIONS

Communication issued Jan. 2, 2025 by the Korean Intellectual Property Office in Korean Patent Application No. 10-2021-0194446.

* cited by examiner

THIN FILM DEPOSITION APPARATUS HAVING MULTI-STAGE HEATERS AND THIN FILM DEPOSITION METHOD USING THE SAME

CROSS-REFERENCE TO RELATED APPLICATION

This application claims priority from Korean Patent Application No. 10-2021-0194446 filed on Dec. 31, 2021, in the Korean Intellectual Property Office, the disclosure of which is incorporated herein in its entirety by reference.

BACKGROUND

1. Field

The embodiments of the disclosure relate to thin film deposition technology, and more particularly, to a thin film deposition apparatus for depositing a thin film by supplying a reaction gas to a plurality of vertically stacked substrates and a thin film deposition method using the same.

2. Description of Related Art

In general, as examples of a thin film deposition method for depositing a thin film by supplying a reaction gas to a substrate, atomic layer deposition (ALD) and chemical vapor deposition (CVD) are known. The atomic layer deposition is a method of adsorbing and depositing a thin film on a substrate by alternately supplying and purging a reaction gas to the substrate, and the chemical vapor deposition is a method of depositing a thin film on the substrate by simultaneously spraying a reaction gas.

In an apparatus using such a thin film deposition method, a single substrate reactor directly heats the substrate and uniformly supplies the reaction gas to the substrate at a temperature lower than that of the substrate. Since such an apparatus processes only a single substrate, a high-quality thin film may be obtained, but there is a problem in that productivity is significantly reduced under the condition that deposition needs to be performed at a low deposition rate.

In this respect, there has been disclosed a thin film deposition apparatus including a substrate supporting portion for vertically stacking and supporting a plurality of substrates inside a reaction chamber, a plurality of heaters disposed to respectively correspond to lower portions of the plurality of substrates to heat the substrates, and a heater support for vertically stacking and supporting the plurality of heaters. In particular, the substrate supporting portion includes a plurality of substrate supports standing vertically outside the plurality of substrates, a lift pin coupled to a substrate support to support a lower portion of a corresponding substrate, and a substrate driver for elevating and lowering the substrate support to seat or detach the corresponding substrate supported by the lift pin on or from the heater. Accordingly, the plurality of substrates may be simultaneously processed through the substrate supporting portions and heaters having a multi-stage.

However, when individual heaters are configured in multiple layers, a stable support structure of a substrate disposed on the heaters of each layer or a cable connection method for stably supplying power to the heaters of each layer is not considered. In addition, there is a problem in that heat generated by one heater among the vertical multi-stage heaters causes an unintended temperature change in other adjacent heaters.

SUMMARY

Example embodiments of the disclosure provide a thin film deposition apparatus that provides a stable substrate support required when a plurality of heaters are configured in multiple layers.

The example embodiments also provide a thin film deposition apparatus that minimizes a temperature influence due to heat generation for each layer in vertical multi-stage heaters.

The example embodiments may address a problem that a back surface of a heater or a back surface of a substrate is deposited by forming a partition wall for each layer of a substrate support.

The example embodiments may also reduce non-uniformity of a temperature of a substrate to be processed by allowing vertical multi-stage heaters to be individually controlled.

According to an example embodiment, there is provided a thin film deposition apparatus which may include: a chamber configured to process a plurality of substrates; a plurality of heater members disposed to correspond to the substrates to heat the substrates, respectively; a plurality of lift pins configured to support lower surfaces of the substrates while elevating through the heater members, respectively; a plurality of heat shield plates, having a heat shield function between the heater members, on which lower ends of the lift pins are configured to be seated; and a plurality of support columns coupled with and supporting the heater members.

The heat shield plates may be made of a ceramic material to block heat transfer between adjacent heater members.

The thin film deposition apparatus may further include: a base on which the support columns are seated; and a driver configured to elevate, lower or rotate the base in the chamber.

The thin film deposition apparatus may further include: a plurality of spray ports corresponding to the substrates and formed on a sidewall of the chamber, and configured to supply a process gas to the substrates; and a plurality of exhaust ports corresponding to the substrates, and configured to discharge a residual gas remaining after the process gas makes deposition on the substrates.

When the substrates are loaded on the heat members, the lift pins may be protruded upward from the heater members, and when the substrates are being deposited, the lift pins may not be protruded upward from the heater members.

The support columns may include a base column, and a heater member among the plurality of heater members may be supported from the base by the base column in an end-to-end manner.

The support columns may include a connection column, and when the heater member is not the uppermost heater member, the heater member may be connected to the uppermost heater member by the connection column.

The base column and the connection column may be disposed in line with each other.

A sum of lengths of the base column and the connection column disposed in line with each other may be equal to a sum of lengths of another base column and another connection column regardless of a position occupied by the heater member among the heater members.

The base column may have a hollow formed in a longitudinal direction, and a cable for supplying power to a heat source for heating the heater member is accommodated in the hollow.

The plurality of support columns may include: a same number of base columns as the heater members; and one or more connection columns, of which a number is smaller than the heater members by one (1).

The heat member may include an upper open groove for seating the connection column and a through hole for coupling another connection column connected from another heater member.

The heat members may include the uppermost heater member including a lower open groove for coupling another connection column connected from another heater member.

Each of a number of the heater members, a number of the heat shield plates, and a number of the support columns may be four (4).

The four support columns may be disposed to have a short circumferential distance space and a long circumferential distance space along circumferential directions of the heater members and the heat shield plates, and the substrates may be loaded and unloaded through the long circumferential distance space.

The heat shield plates may include recesses that are concave in an inner radial direction within a predetermined circumferential angle to prevent interference in connecting the four support columns between the heater members.

Each of the recess may have the predetermined circumferential angle corresponding to the short circumferential distance space.

Each of the heat shield plates may have an area greater than that of a corresponding heater member among the heat members to have a heat shielding effect between the heater members.

The lift pins formed on the heat shield plates may be synchronously elevated.

The thin film deposition apparatus of may further include a plurality of temperature sensors mounted inside the chamber to correspond to the heater members, wherein each of the members is controlled to an individual temperature based on temperatures detected by the temperature sensors.

According to the thin film deposition apparatus according to the example embodiments, a temperature uniformity effect of the substrate, which is difficult to implement in existing furnace equipment, may be expected.

Further, according to the thin film deposition apparatus according to the example embodiments, there is provided a substrate support structure that may efficiently support a substrate while preventing a problem in that heat is transferred to each layer during up/down movement in a vertical direction in the conventional vertical multi-stage heaters.

Further, according to the thin film deposition apparatus according to the example embodiments, it may be possible to maintain temperature uniformity between the heaters while improving deposition uniformity by rotation when spraying a process gas.

BRIEF DESCRIPTION OF DRAWINGS

The above and other aspects and features of the disclosure will become more apparent by describing in detail example embodiments thereof with reference to the attached drawings, in which.

DETAILED DESCRIPTION OF EMBODIMENTS

Figure 1:
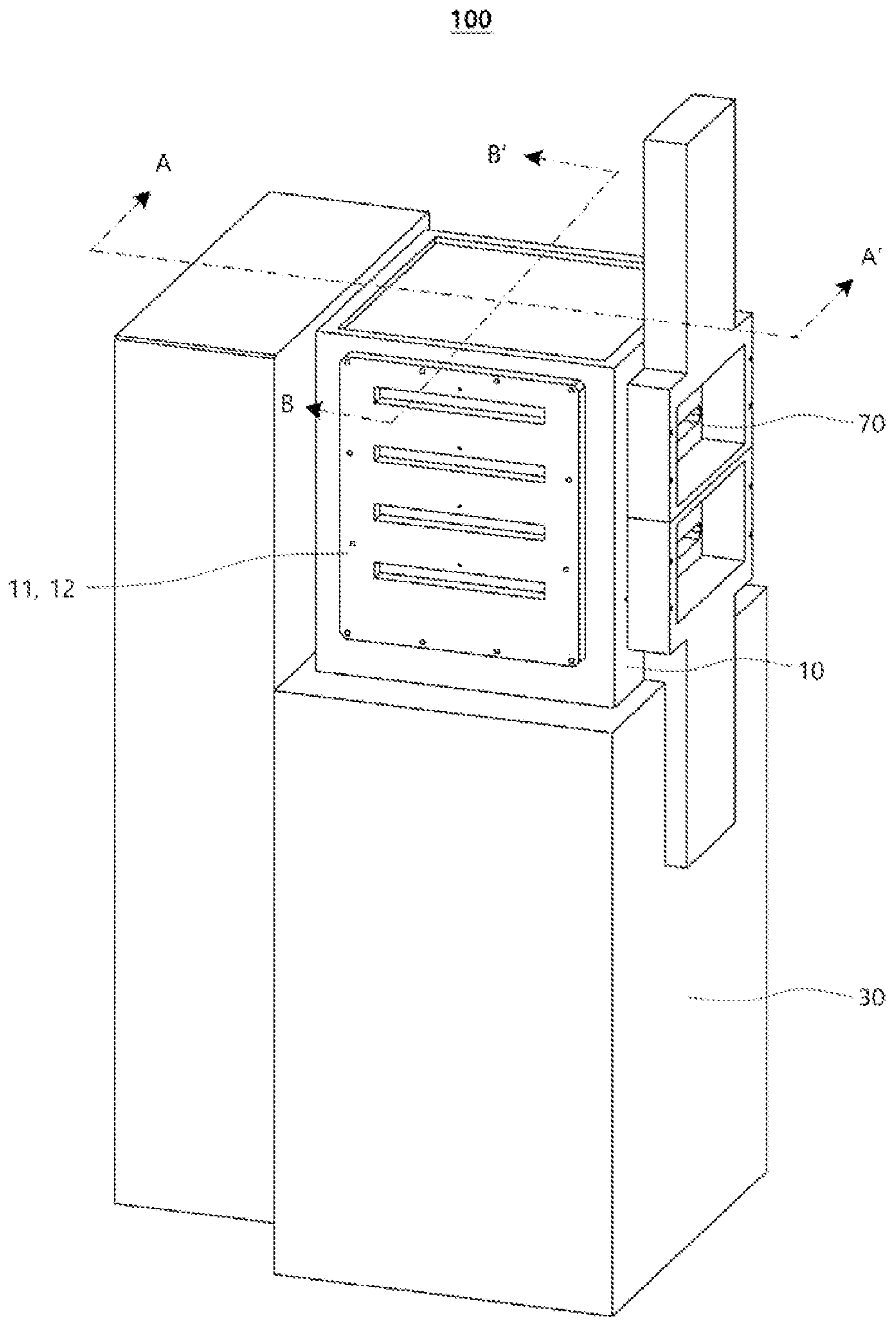
FIG. 1 is a perspective view illustrating a thin film deposition apparatus according to an example embodiment.

Advantages and features of the disclosure and methods to achieve them will become apparent from the descriptions of example embodiments herein below with reference to the accompanying drawings. However, the disclosure is not limited to example embodiments disclosed herein but may be implemented in various ways. The example embodiments are provided for making the disclosure thorough and for fully conveying the scope of the disclosure to those skilled in the art. It is to be noted that the scope of the disclosure is defined only by the claims. Like reference numerals denote like elements throughout the descriptions.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Terms used herein are for illustrating the embodiments rather than limiting the disclosure. As used herein, the singular forms are intended to include plural forms as well, unless the context clearly indicates otherwise. Throughout this specification, the word “comprise” and variations such as “comprises” or “comprising,” will be understood to imply the inclusion of stated elements but not the exclusion of any other elements.

Hereinafter, example embodiments will be described in detail with reference to the accompanying drawings.

FIG. 1 is a perspective view illustrating a thin film deposition apparatus 100 according to an example embodiment.

The thin film deposition apparatus 100 may include a chamber 10 for processing a plurality of substrates, a substrate entrance 70 for loading or unloading the substrates by a substrate transfer means such as a robot arm (not shown), a spray port 11 formed on a sidewall of the chamber 10 to supply a process gas to each of the substrates, and an exhaust port 12 for discharging residuals of the process gas. In addition, the thin film deposition apparatus 100 may include a lower block 30 including a driver 20 (shown in FIGS. 2A and 1B) for elevating or rotating components in the chamber 10.

Figure 2A:
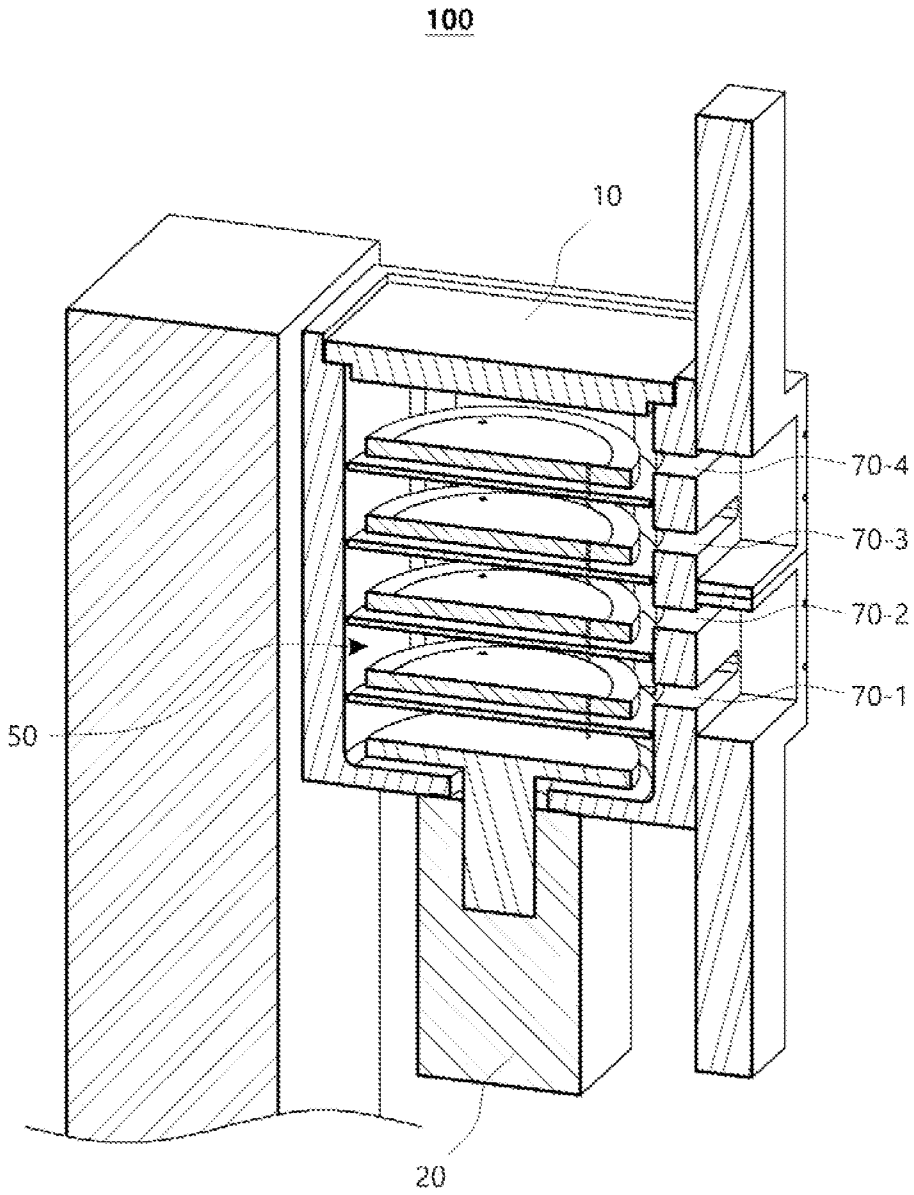
FIG. 2A is a cross-sectional perspective view of the thin film deposition apparatus of FIG. 1 taken along a line A-A'.
Figure 2B:
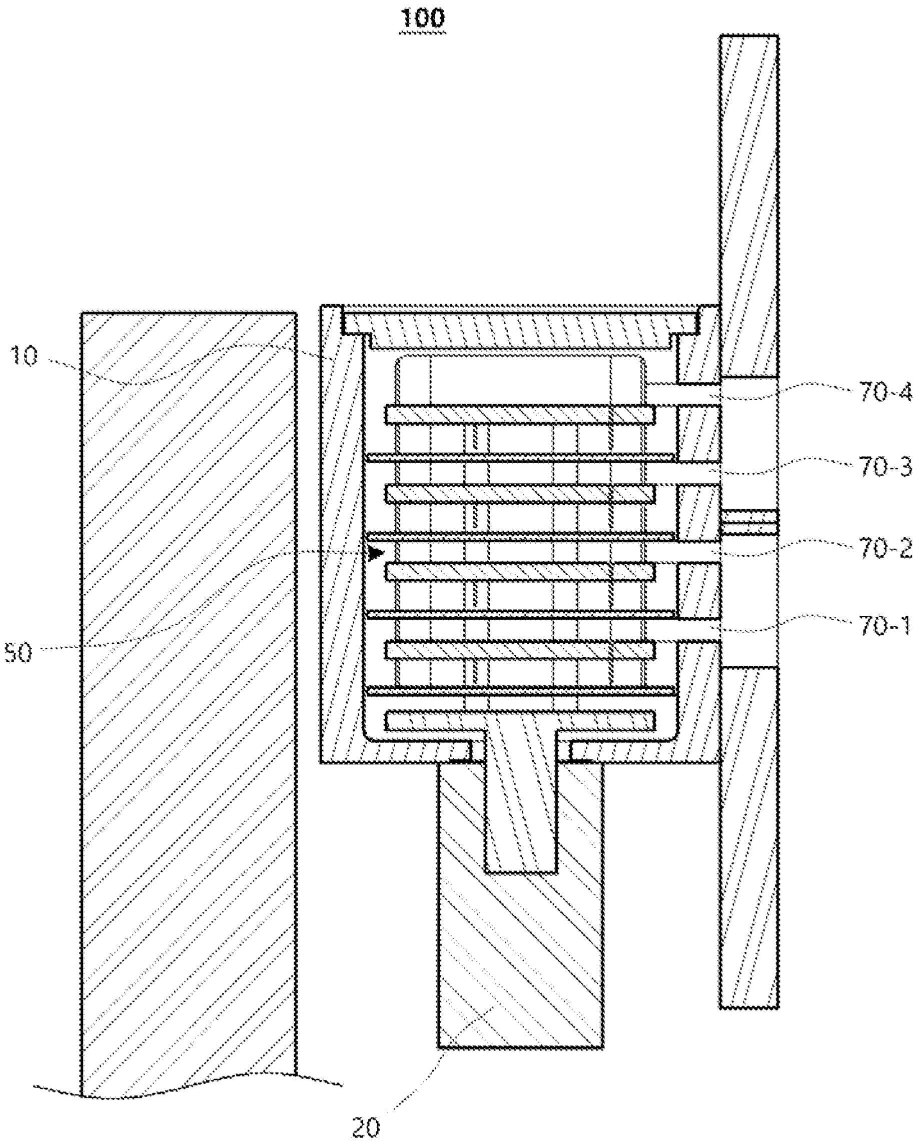
FIG. 2B is a longitudinal cross-sectional view of the thin film deposition apparatus of FIG. 1 taken along a line A-A'.

FIG. 2A is a cross-sectional perspective view of the thin film deposition apparatus 100 of FIG. 1 taken along a line A-A' and FIG. 2B is a longitudinal cross-sectional view of the thin film deposition apparatus 100 of FIG. 1 taken along a line A-A'. Referring to FIGS. 2A and 2B, a multi-stage heater assembly 50 in which heater members and heat shield plates are installed in multiple layers may be accommodated inside the chamber 10. This multi-stage heater assembly 50 may be configured to be able to be elevated and rotated by the driver 20 disposed at a lower side thereof. The driver 20 may be configured such that, for example, a rotatable motor is disposed on an elevatable linear actuator to provide both rotating and elevating motions. The rotation generally refers to a rotational motion within 360 degrees while changing a direction of rotation, and the elevation refers to a linear motion between a load position for loading or unloading a substrate and a process position for deposition on the substrate.

Figure 3A:
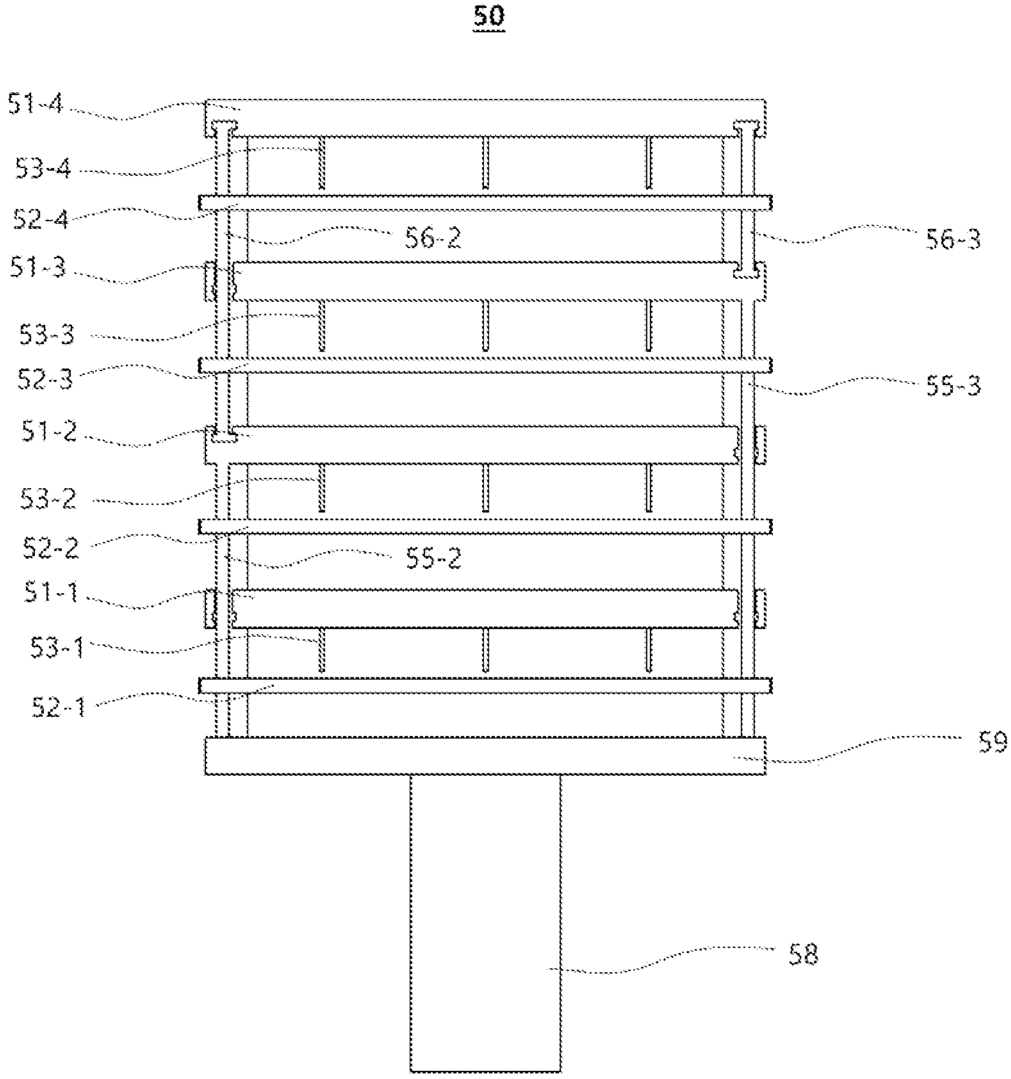
FIG. 3A is a front view illustrating a multi-stage heater assembly mounted on a base at a process position.
Figure 3B:
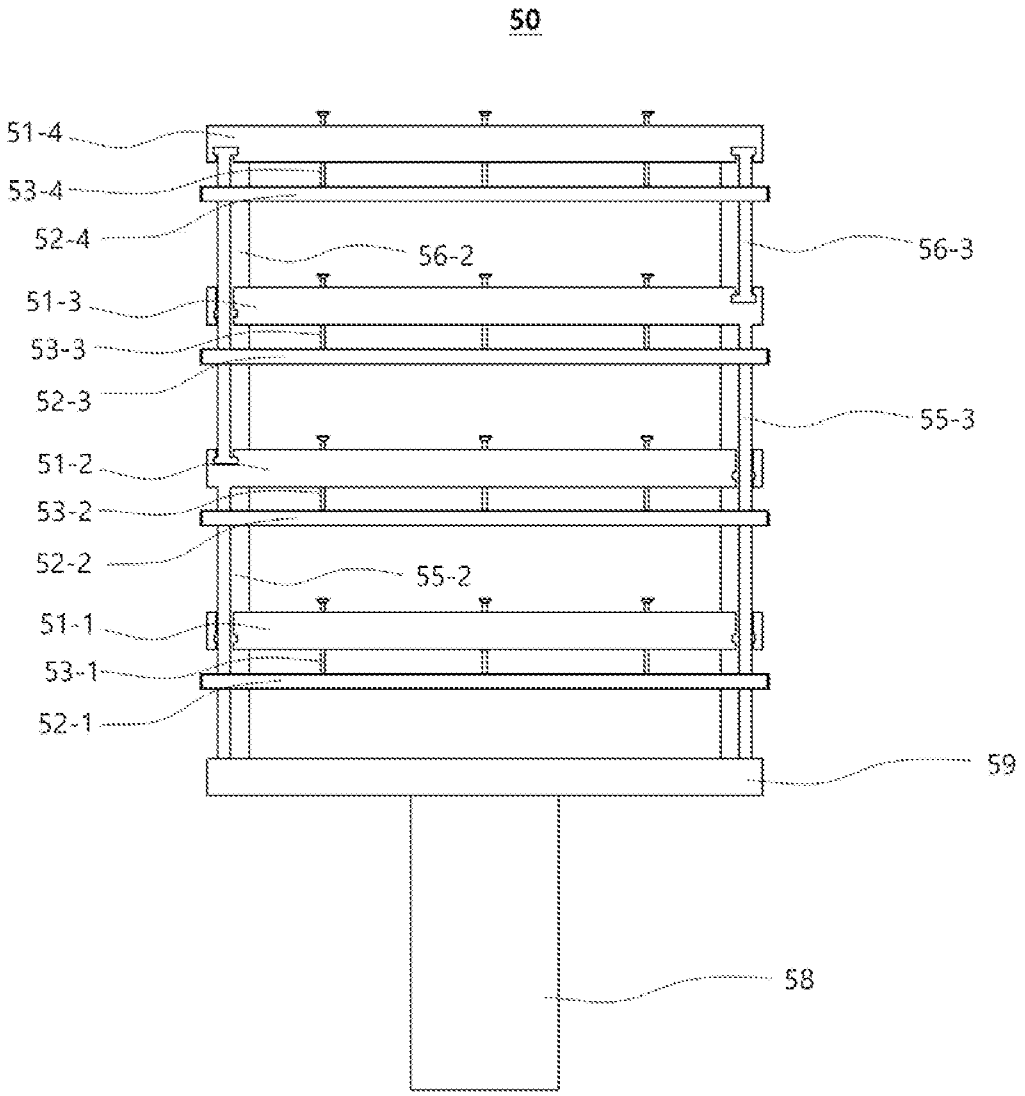
FIG. 3B is a front view illustrating the multi-stage heater assembly mounted on the base at a load position.

FIG. 3A is a front view illustrating a multi-stage heater assembly 50 mounted on a base 59 at a process position, and FIG. 3B is a front view illustrating the multi-stage heater assembly 50 mounted on the base 59 at a load position.

Figure 4:
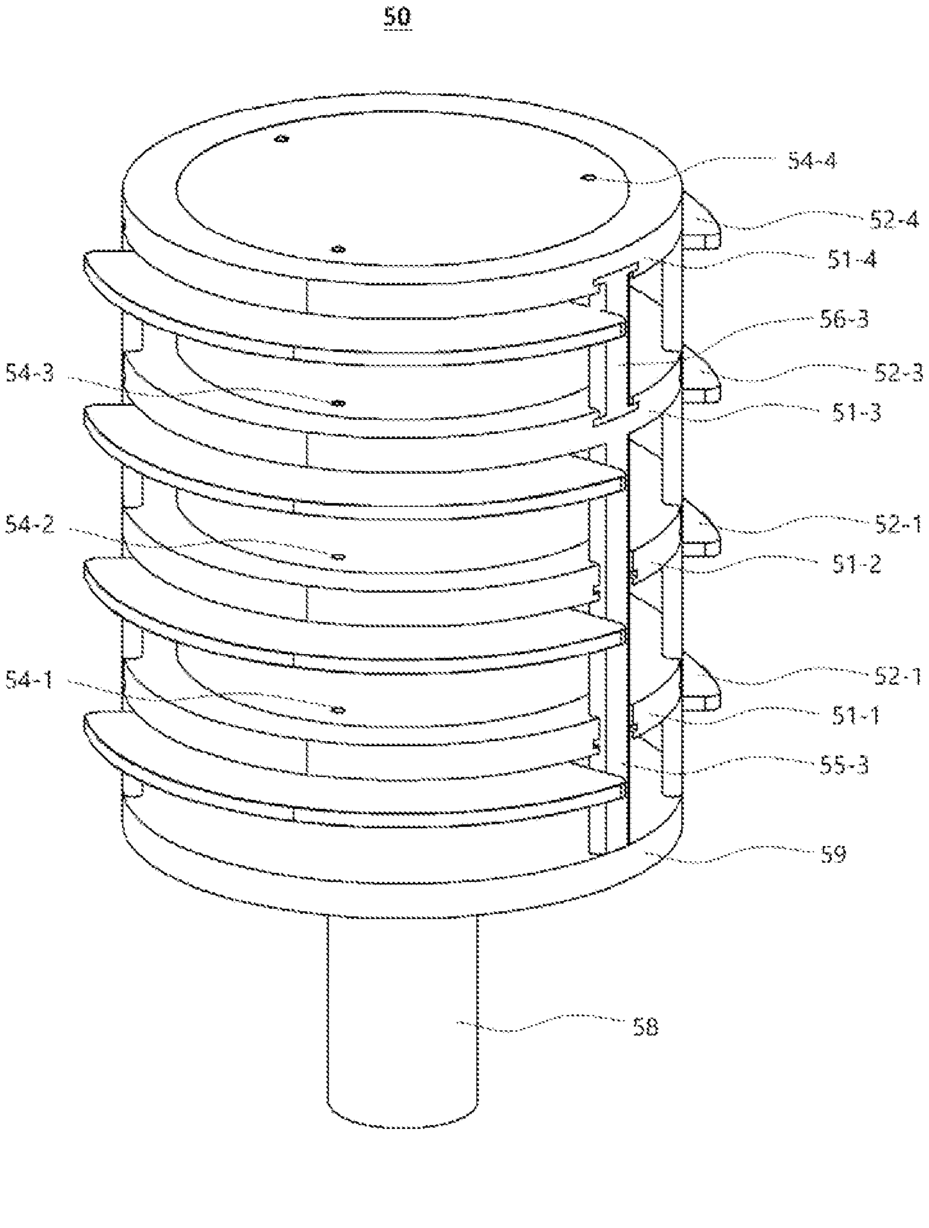
FIG. 4 is a perspective view illustrating the multi-stage heater assembly of FIG. 3A.

The multi-stage heater assembly 50 may include a plurality of heater members 51-1, 51-2, 51-3, and 51-4 disposed to correspond to a lower portion of each of the substrates (not illustrated) to heat the substrates, a plurality of sets of lift pins 53-1, 53-2, 53-3, and 53-4 supporting lower surfaces of the substrates while elevating through each of the heater members 51-1, 51-2, 51-3, and 51-4, and a plurality of heat shield plates 52-1, 52-2, 52-3, and 52-4 having a heat shield function between the heater members and on which lower ends of the sets of the lift pins 53-1, 53-2, 53-3, and 53-4 may be seated. Each set of the lift pins 53-1, 53-2, 53-3, and 53-4 may include at least one lift pin. As illustrated in FIG. 4 to be described later, the lift pins 53-1, 53-2, 53-3, and 53-4 may be inserted into a plurality of sets of through-holes 54-1, 54-2, 54-3, and 54-4 formed by penetrating through the heater members 51-1, 51-2, 51-3, and 51-4 and elevated based on the heater members 51-1, 51-2, 51-3, and 51-4. Each set of the through-holes 54-1, 54-2, 54-3, and 54-4 may include at least one through-hole for a corresponding at least one lift pin.

When the substrates are loaded/unloaded at the load position, the lift pins 53-1, 53-2, 53-3, and 53-4 may protrude upward from the heater members 51-1, 51-2, 51-3, and 51-4 as illustrated in FIG. 3B. On the other hand, when the substrates are deposited at the process position, the lift pins 53-1, 53-2, 53-3, and 53-4 may not protrude upward from the heater members 51-1, 51-2, 51-3, and 51-4. As a result, the substrates may be seated on the heater members 51-1, 51-2, 51-3, and 51-4. As described above, the lift pins 53-1, 53-2, 53-3, and 53-4 may be inserted into the through-holes 54-1, 54-2, 54-3, and 54-4 of the heater members, and may be elevated therein, while lower ends of the lift pins 53-1, 53-2, 53-3, and 53-4 may be seated on upper surfaces of the heat shield plates 52-1, 52-2, 52-3, and 52-4 (acting as a stopper) or may be slightly spaced apart from the upper surfaces depending on a working sequence in the chamber 10. In addition, the lift pins 53-1, 53-2, 53-3, and 53-4 may be synchronously elevated within the chamber 10 regardless of the layers to which the lift pins 53-1, 53-2, 53-3, and 53-4 belong.

The heater members 51-1, 51-2, 51-3, and 51-4 may be integrally coupled with and supported by a plurality of support columns 55 and 56. The support columns 55 and 56 may include a plurality of base columns 55 (55-1, 55-2, 55-3, and 55-4) and a plurality of connection columns 56 (56-1, 56-2, and 56-3), which will be described later in reference to FIGS. 7A-7B to 9A-9D. As an example, the heater members 51-1, 51-2, 51-3, and 51-4 may be integrally formed with corresponding base columns 55 (55-1, 55-2, 55-3, and 55-4), respectively, and may be connected to and supported by corresponding connection columns 56 (56-1, 56-2, and 56-3), respectively. Alternatively or additionally, the heater members 51-1, 51-2, 51-3, and 51-4 may be provided to be separable from and coupled to the base columns 55 and the connection columns 56. Accordingly, when any one of the heater members 51-1, 51-2, 51-3, and 51-4 is damaged or broken, a maintenance cost of the apparatus may be improved because only the damaged or broken heater member 51 may be replaced instead of all of the heater members 51.

The support columns 55 and 56 may be seated on the base 59 disposed on a lower side thereof. In addition, a shaft 58 coupled to the driver 20 extends from the base 59. In this case, the driver 20 may elevate and lower the base 59 in the chamber 10 by an elevating/lowering module included therein, and at the same time, may rotate the base 59 in the chamber 10 by a rotation module included therein. Therefore, the multi-stage heater assembly 50 coupled by the support columns 55 and 56 may be integrally elevated, lowered or rotated together with the base 59. However, the heat shield plates 52-1, 52-2, 52-3, and 52-4 may support the lower ends of the lift pins 53-1, 53-2, 53-3, and 53-4 when the heater members 51-1, 51-2, 51-3, and 51-4 are lowered, and may be slightly spaced apart from the lower ends of the lift pins 53-1, 53-2, 53-3, and 53-4 when the heater members 51-1, 51-2, 51-3, and 51-4 are elevated. In this case, according to the working sequence in the chamber 10, a separate driving element may be required to allow the heat shield plates 52-1, 52-2, 52-3, and 52-4 to have relative motions with respect to the heater members 51-1, 51-2, 51-3, and 51-4. Thus, there may be considered a method of disposing a separate driving apparatus for elevating the heat shield plates 52-1, 52-2, 52-3, and 52-4, or forming protrusions on the support columns 55 and 56 so as to be elevated together with the heater members 51-1, 51-2, 51-3, and 51-4 after a certain point when the heat shield plates 52-1, 52-2, 52-3, and 52-4 are elevated.

For the above-described functions of elevation, lowering and rotating, the driver 20 may also include one or more processors, such as a microprocessor, executing various computer instructions to controls the elevating/lowering module and the rotation module which may be formed of hardware and/or software. The driver 20 may also include one or more memories storing the computer instructions to be executed by the processors.

As described above, it is illustrated and described in the example embodiment that the number of multiple layers is four, but the disclosure is not limited thereto, and may be applicable to more or less than four layers. However, considering the simultaneous processing of the substrates, convenience of loading/unloading of the substrates, and the number of support columns, it is preferable, but not necessary, that the number of the multiple layers is four.

FIG. 4 is a perspective view illustrating the multi-stage heater assembly 50 of FIG. 3A.

As described above, since thermal interference may occur between the heater members 51-1, 51-2, 51-3, and 51-4, which may lead to non-uniformity in deposition on the substrate, the heat shield plates 52-1, 52-2, 52-3, and 52-4 may be disposed between the heater members 51-1, 51-2, 51-3, and 51-4. In a substrate loading/unloading operation as illustrated in FIG. 3B, since the lower ends of the lift pins may be supported by the upper surfaces of the heat shield plates 52-1, 52-2, 52-3, and 52-4, the heat shield plates 52-1, 52-2, 52-3, and 52-4 may have a function of supporting the substrate through the lift pins as well as a function of shielding heat. In order to improve a heat shielding effect of the heat shield plates 52-1, 52-2, 52-3, and 52-4, the heat shield plates 52-1, 52-2, 52-3, and 52-4 may include non-metallic materials such as a ceramic, a synthetic resin, and a synthetic rubber, not being limited thereto. In addition, the heat shield plates 52-1, 52-2, 52-3, and 52-4 may have an area greater than that of the heater members 51-1, 51-2, 51-3, and 51-4, and may have a size corresponding to an inner surface of a sidewall 10*a* in the chamber 10. In addition, the heat shield plates 52-1, 52-2, 52-3, and 52-4 having a large area may also contribute to preventing a problem in that a process gas of a specific layer makes deposition on a back surface of the heater member or a back surface of the substrate in an upper layer.

Meanwhile, it is preferable but not necessary that the support columns 55 and 56 may be disposed to have different circumferential intervals, that is, to have a short circumferential distance space and a long circumferential distance space, along circumferential directions of the heater members 51-1, 51-2, 51-3, and 51-4 and the heat shield plates 52-1, 52-2, 52-3, and 52-4. The reason for disposing the support columns 55 and 56 in this manner is to secure a sufficient space so that the substrate may be loaded/unloaded on the heater members 51-1, 51-2, 51-3, and 51-4. Therefore, the substrates may be loaded and unloaded through the long circumferential distance space between the support columns 55 and 56. Therefore, in FIG. 2A, the substrate entrances 70-1, 70-2, 70-3, and 70-4 may be all aligned with the long circumferential distance space between the support columns 55 and 56.

Figure 5:
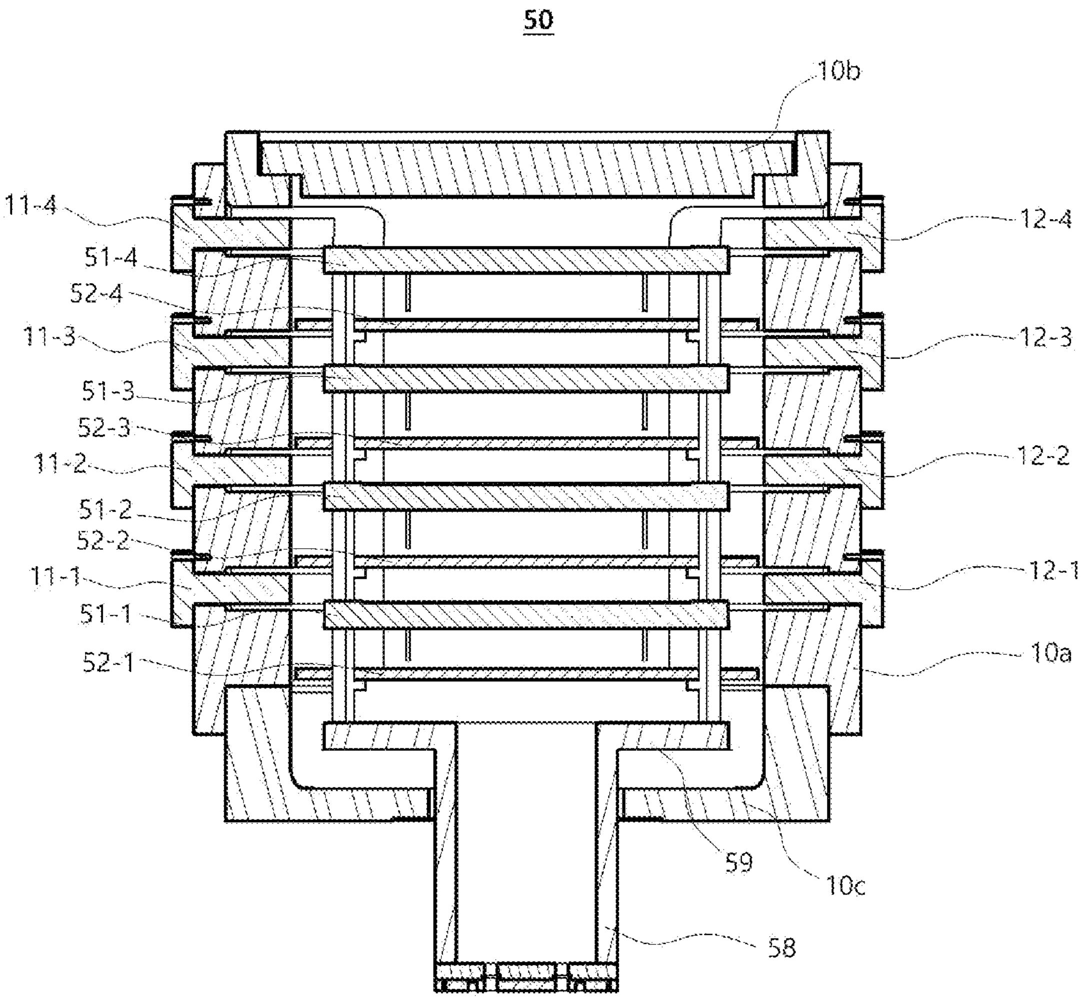
FIG. 5 is a cross-sectional perspective view of the thin film deposition apparatus of FIG. 1 taken along a line B-B'.

FIG. 5 is a cross-sectional perspective view of the thin film deposition apparatus 100 of FIG. 1 taken along a line B-B'. The chamber 10 may include a sidewall 10*a*, an upper cover 10*b*, and a lower wall 10*c*. Here, the upper cover 10*b* may be provided to open the inside of the chamber 10 for management, and the lower wall 10*c* may include an opening to allow the shaft 58 extending from the base 59 to penetrate therethrough.

A plurality of spray ports 11-1, 11-2, 11-3, and 11-4 and a plurality of exhaust ports 12-1, 12-2, 12-3, and 12-4 corresponding to the substrates may be installed on the sidewall 10*a* of the chamber 10. The injection ports 11-1, 11-2, 11-3, and 11-4 may supply a process gas to each of the substrates, and the exhaust ports 12-1, 12-2, 12-3, and 12-4 may have a function of discharging a residual gas remaining after the process gas makes deposition on the substrates.

When the heater members 51-1, 51-2, 51-3, and 51-4 are further elevated from the positions illustrated in FIG. 5 to be disposed for the deposition process, the spray ports 11-1, 11-2, 11-3, and 11-4 may be closest to upper surfaces of the substrates or heater members 51-1, 51-2, 51-3, and 51-4. That is, a deposition space for processing each substrate may be positioned on the same line as each spray port and exhaust port within an error range.

In this case, four deposition spaces corresponding to the four spray ports 11-1, 11-2, 11-3, and 11-4 may be formed. For example, a fourth spray port 11-4 may be responsible for or correspond to a deposition space between the upper cover 10*b* and the heater member 51-4, a third spray port 11-3 may be responsible for or correspond to a deposition space between the heat shield plate 52-4 and the heater member 51-3, a second spray port 11-2 may be responsible for or correspond to a deposition space between the heat shield plate 52-3 and the heater member 51-2, and a first spray port 11-1 may be responsible for or correspond to a deposition space between the heat shield plate 52-2 and the heater member 51-1.

In addition, when the deposition space is formed through the elevation of the heater members 51-1, 51-2, 51-3, and 51-4, heights and sizes of the deposition spaces may also be controlled or changed according to the elevation positions of the heater members 51-1, 51-2, 51-3, and 51-4. Therefore, it may also be possible to finely adjust the elevation heights of the heater members 51-1, 51-2, 51-3, and 51-4 by the elevating/lowering module of the driver 20 depending on the deposition conditions such as the size of the substrate, the type of deposition gas, and the deposition rate.

Meanwhile, although not illustrated, a plurality of temperature sensors mounted to correspond to the heater members 51-1, 51-2, 51-3, and 51-4 may be provided inside the chamber 10. Accordingly, variable control may be possible so that each of the heater members 51-1, 51-2, 51-3, and 51-4 may be controlled to an individual temperature based on temperatures detected by the temperature sensors. That is, when heat shielding is not sufficiently achieved even by the heat shield plates 52-1, 52-2, 52-3, and 52-4, the substrate may be deposited at a more accurate temperature through variable temperature controls. In addition, as the temperature of each of the heater members 51-1, 51-2, 51-3, and 51-4 may be individually controlled, temperatures of the deposition spaces may be individually controlled. To this end, separate heat sources and power cables may need to be provided for each of the heater members 51-1, 51-2, 51-3, and 51-4. This will be described later with reference to FIG. 9A.

Figure 6:
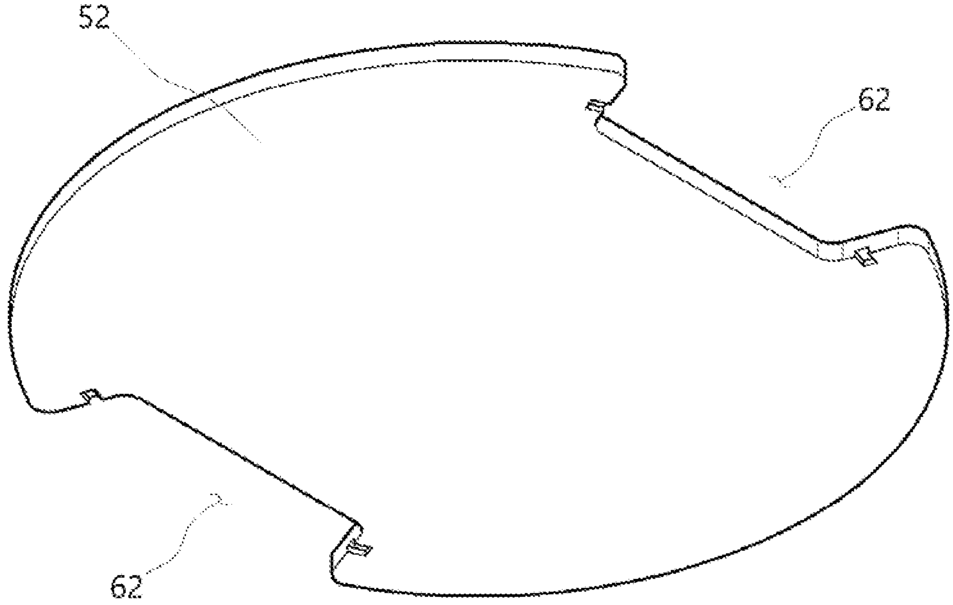
FIG. 6 is a bottom perspective view of a heat shield plate according to an example embodiment viewed from below.

FIG. 6 is a bottom perspective view of heat shield plate 52 (52-1, 52-2, 52-3, and 52-4) according to an example embodiment viewed from below. As illustrated, recesses 62 that are concave in an inner radial direction within a predetermined circumferential angle are formed in the heat shield plate 52 to prevent interference in connecting the support columns 55 and 56 between the heater members 51-1, 51-2, 51-3, and 51-4.

In this case, the recess 62 has the circumferential angle sized to cover the short circumferential distance space between the support columns 55 and 56 as illustrated in FIG. 4.

Figure 7A:
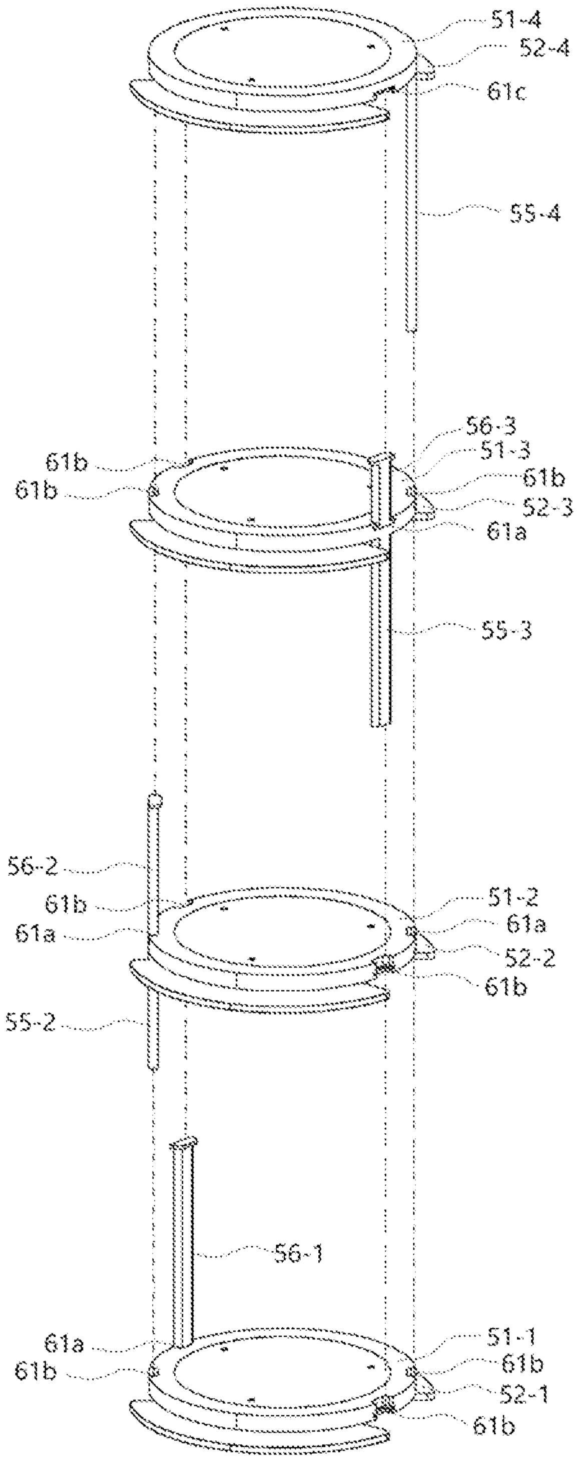
FIG. 7A is an exploded perspective view of a multi-stage heater assembly excluding a base according to an example embodiment.
Figure 7B:
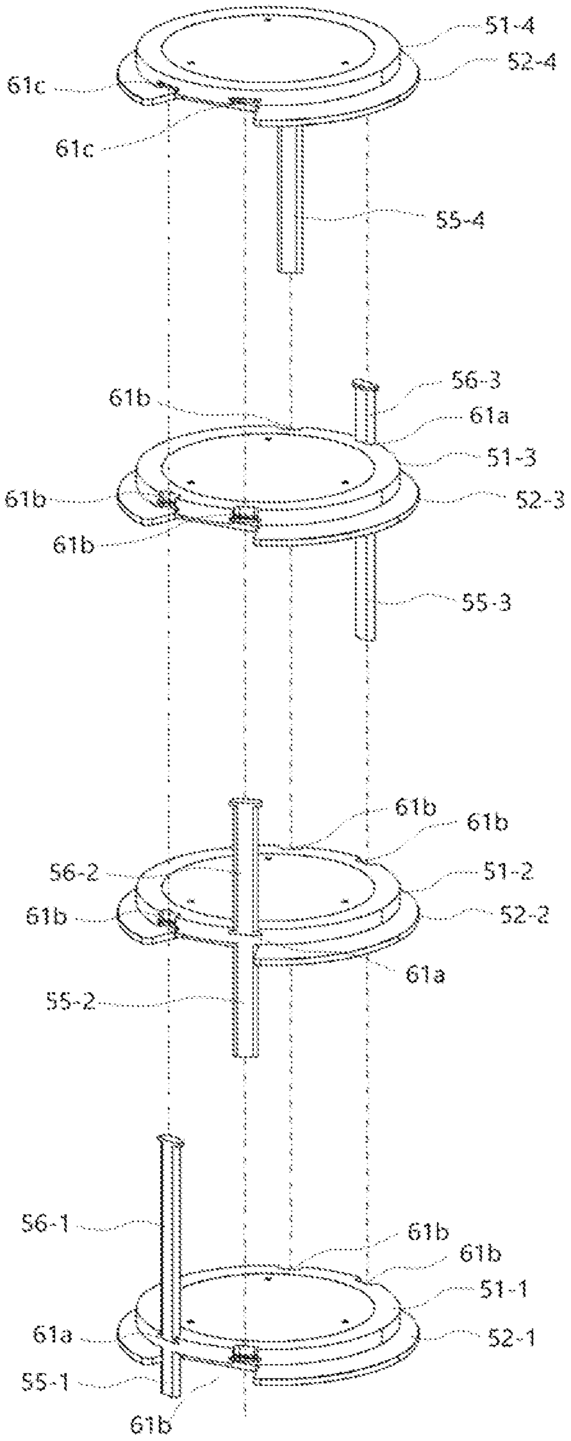
FIG. 7B is an exploded perspective view of the multi-stage heater assembly of FIG. 7A viewed from a direction different from that of FIG. 7A.

FIG. 7A is an exploded perspective view of a multi-stage heater assembly excluding a base 59 according to an example embodiment, and FIG. 7B is an exploded perspective view of the multi-stage heater assembly of FIG. 7A viewed from a direction different from that of FIG. 7A.

The support columns 55 and 56 include the base columns 55-1, 55-2, 55-3, and 55-4, and the connection columns 56-1, 56-2, and 56-3 disposed in line with the base columns 55-1, 55-2, 55-3 and 55-4.

The base columns 55-1, 55-2, 55-3, and 55-4 may serve to support the heater members 51-1, 51-2, 51-3, and 51-4, respectively, from the base 59 in an end-to-end manner. In addition, the connection columns 56-1, 56-2, and 56-3 may serve to connect the heater members 51-1, 51-2, 51-3, and 51-4 to the uppermost heater member 51-4, respectively, by remaining lengths excluding the base columns. For the uppermost heater member 51-4, however, there may be no connection member (i.e., 56-4 if any) for connection thereon.

As illustrated in FIGS. 7A and 7B, a sum of lengths of a base column and a connection column in line with each other may be equal to a sum of lengths of another base column and another connection column in line with each other irrespective of the four positions of combinations of the base columns 55 and 56 in the circumferential direction. In other words, even if the base column and the other base column may have different lengths, and the connection column and the other connection member may also have different lengths, the sum of the lengths of the base column and the connection column in line with each other may be equal to the sum of the lengths of the other base column and the other connection column in line with each other.

For example, when a length of the base column 55-1 supporting the heater member 51-1 of a first layer from the base 59 is 1 unit, a length of the connection column 56-1 connected to the base column 55-1 and connected to the heater member 51-4 of a fourth layer is 3 units.

In addition, when a length of the base column 55-2 supporting the heater member 51-2 of a second layer from the base 59 is 2 units, a length of the connection column 56-2 connected to the base column 55-2 and connected to the heater member 51-4 of the fourth layer is 2 units.

In addition, when a length of the base column 55-3 supporting the heater member 51-3 of a third layer from the base 59 is 3 units, a length of the connection column 56-3 connected to the base column 55-3 and connected to the heater member 51-4 of the fourth layer is 1 unit.

Finally, since a length of the base column 55-4 supporting the heater member 51-4 of the fourth layer from the base 59 is 4 units, there is no connection column.

As described above, the sum of the lengths of a base column and a connection column in line with each other is always constant irrespective of the positions of the support columns 55 and 56, and the support columns 55 and 56 include the base columns 55-1, 55-2, 55-3, and 55-4 having the same number as the heater members 51-1, 51-2, 51-3, and 51-4, and the connection columns 56-1, 56-2, and 56-3 having the number smaller than the number of base columns 55-1, 55-2, 55-3, and 55-4 by 1.

Meanwhile, a heater member directly supported by a base column may be formed integrally with the base column, but other heater members may require coupling grooves for coupling the base columns and the connecting columns.

Therefore, as illustrated in FIGS. 7A and 7B, an upper open groove 61*a* for seating a connection column, and a through hole 61*b* for coupling connection columns departing from other heater members 51-1, 51-2, 51-3, and 51-4 or base columns directly supporting other heater members may be formed in each of the heater members 51-1, 51-2, 51-3, and 51-4. However, only a lower open groove 61*c* for coupling other connection columns in addition to the base column 55-4 directly connected from the base 59 may be formed in the uppermost fourth heater member 51-4.

As described above, in a multi-stage thin film deposition apparatus according to example embodiments, one or more base columns 55-1, 55-2, 55-3, and 55-4 connecting the heater members 51-1, 51-2, 51-3, and 51-4 of a plurality of layers and the base 59 may be fixed or integrally formed. Therefore, since each of the heater members 51-1, 51-2, 51-3, and 51-4 is directly connected to the base 59 by at least one base column in every layer, it may be possible to prevent cumulative assembly errors that may occur when a plurality of layers are stacked layer by layer using columns of a same length supporting respectively layers, and it may be possible to solve a problem that a fluctuation of a lower layer leads to a fluctuation of an entire layer. In addition, by forming a hollow inside each of the base columns, a cable for connection between a heat source and a power source in the heater member may be accommodated.

Figure 8:
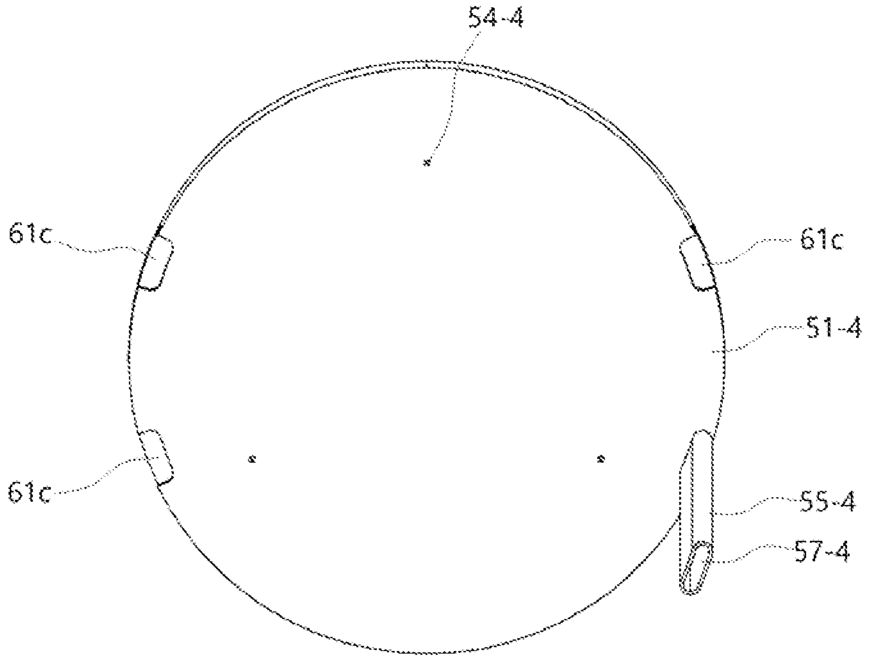
FIG. 8 is a perspective view of a heater member of an uppermost layer among heater members according to an example embodiment viewed from below.

FIG. 8 is a perspective view of a heater member 51-4 of an uppermost layer, that is, a fourth layer among the heater members 51-1, 51-2, 51-3, and 51-4 according to an example embodiment viewed from below. The base column 55-4 connected integrally with the heater member 51-4 has a hollow 57-4 formed therein. The hollow 57-4 provides a sufficient space for accommodating the above-described cable. The base columns 55-1, 55-2 and 55-3 connected integrally with the heater member 51-4 of the fourth layer and the heater members 51-1, 51-2 and 51-3 of other layers may differ from each other only in length and may have hollows for similar functions.

Figure 9A:
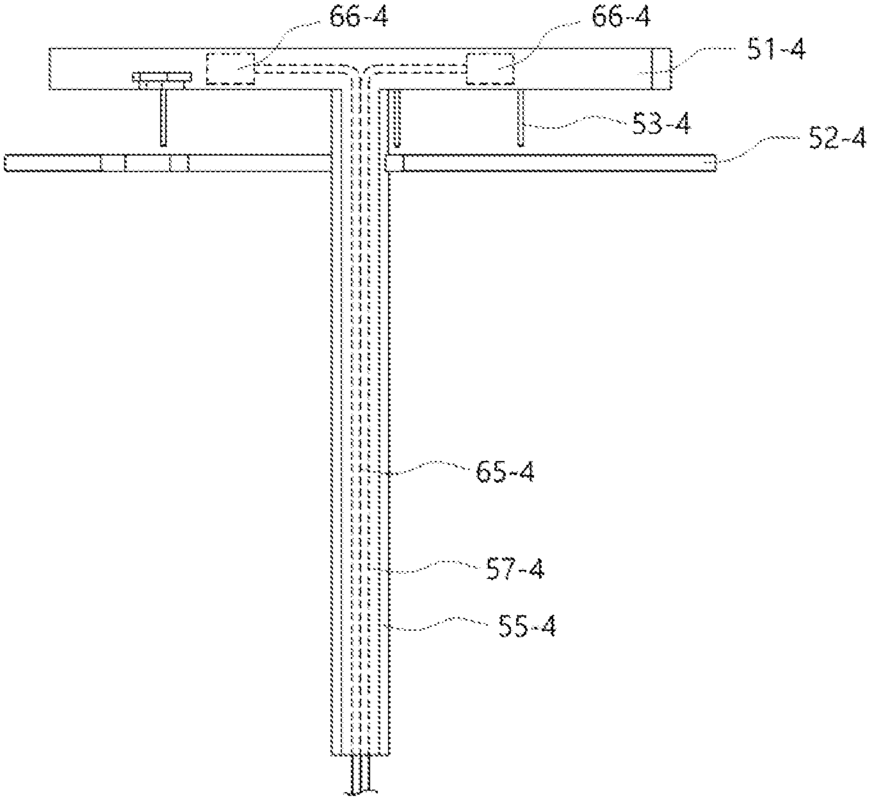
FIG. 9A is a front view illustrating a heater member of a fourth layer, a heat shield plate of a fourth layer, and a corresponding support column according to an example embodiment.

FIG. 9A is a front view illustrating a heater member 51-4 of a fourth layer, a heat shield plate 52-4 of a fourth layer, and a support column 55-4 according to an example embodiment. As illustrated, at least one heat source 66-4 may be disposed inside or adjacent to the heater member 51-4, and a cable 65-4 may be connected between the heat source 66-4 and a power source (not illustrated) disposed in the lower block 30. In this case, the cable 65-4 may be accommodated in the hollow 57-4 formed in the base column 55-4.

Figure 9B:
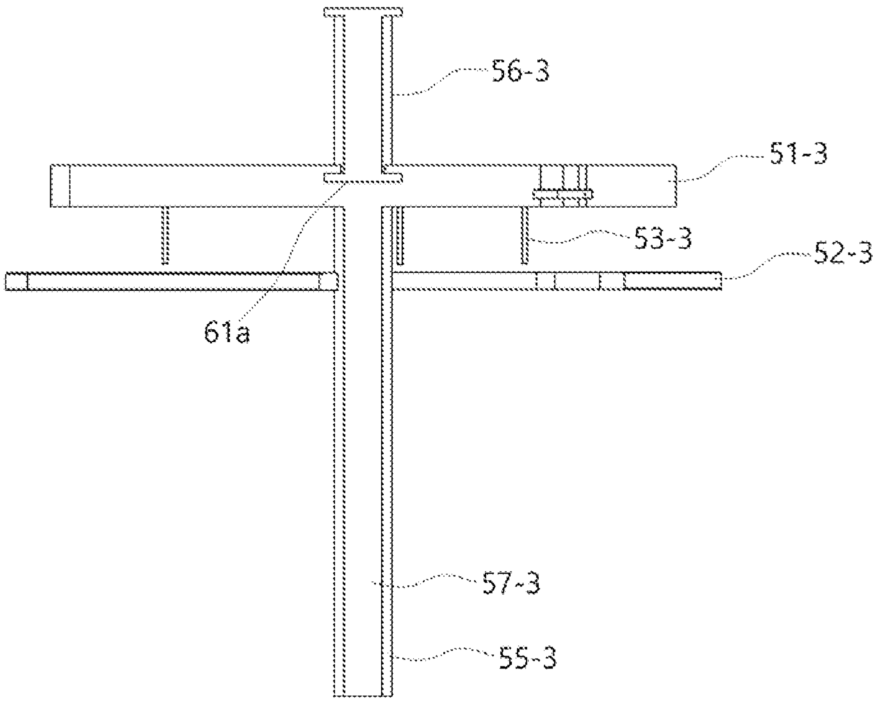
FIG. 9B is a front view illustrating a heater member of a third layer, a heat shield plate of a third layer, and corresponding support columns according to an example embodiment.

FIG. 9B is a front view illustrating a heater member 51-3 of a third layer, a heat shield plate 52-3 of a third layer, and corresponding support columns 55-3 and 56-3 according to an example embodiment. The support columns 55-3 and 56-3 include a base column 55-3 and a connection column 56-3. Redundant illustration is omitted, but in FIG. 9B, a hollow 57-3 is also formed inside the base column 55-3, and a cable for electrical connection with a heat source disposed inside or adjacent to the heater member 51-3 may be accommodated in the hollow 57-3.

Figure 9C:
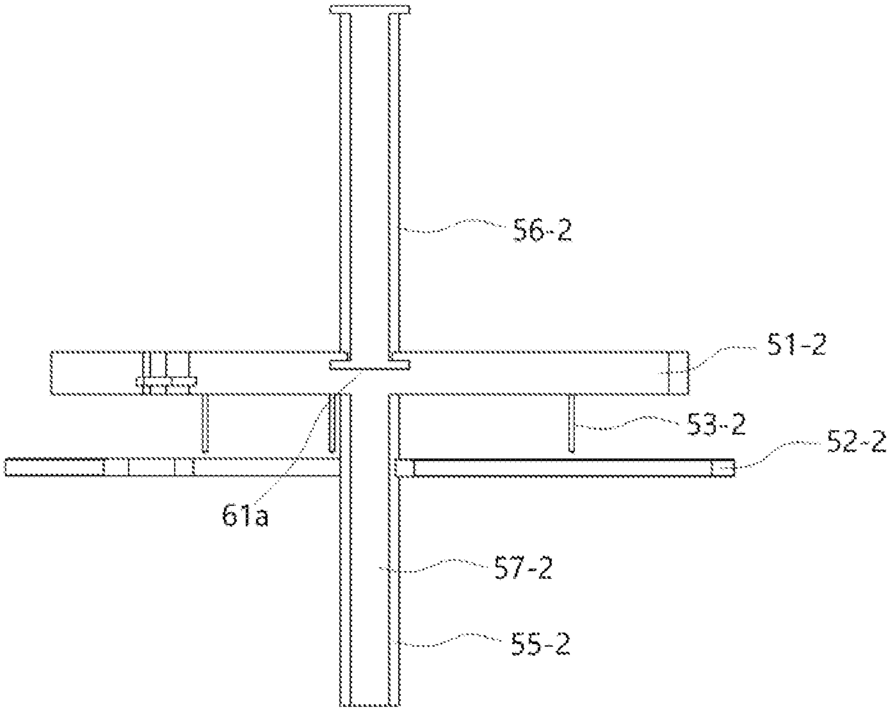
FIG. 9C is a front view illustrating a heater member of a second layer, a heat shield plate of a second layer, and corresponding support columns according to an example embodiment.

FIG. 9C is a front view illustrating a heater member 51-2 of a second layer, a heat shield plate 52-2 of a second layer, and corresponding support columns 55-2 and 56-2 according to an example embodiment. The support columns 55-2 and 56-2 include a base column 55-2 and a connection column 56-2. Redundant illustration is omitted, but in FIG. 9C, a hollow 57-2 is also formed inside the base column 55-2, and a cable for electrical connection with a heat source disposed inside or adjacent to the heater member 51-2 may be accommodated in the hollow 57-2.

Figure 9D:
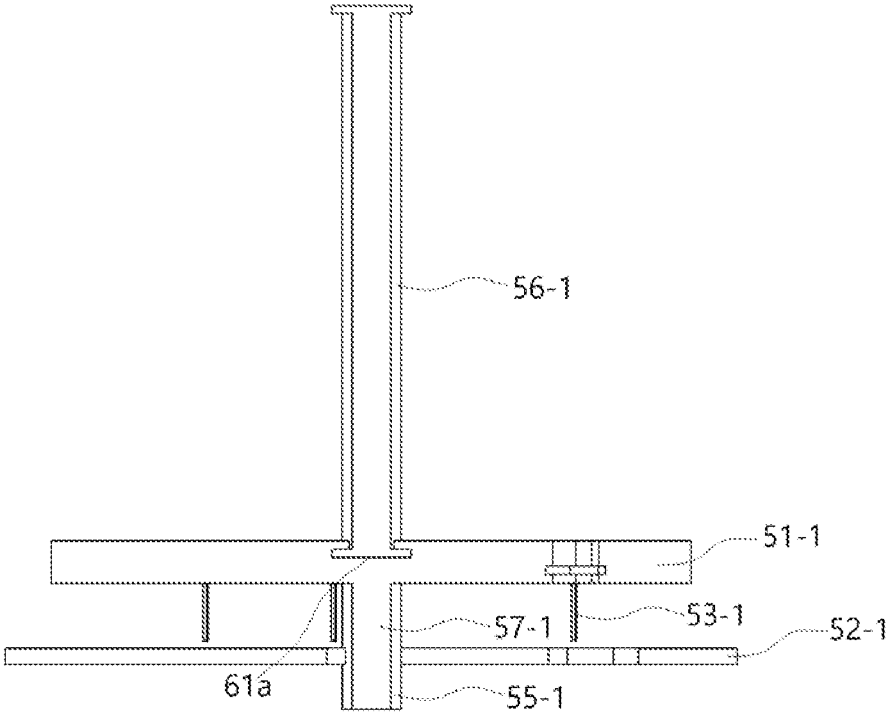
FIG. 9D is a front view illustrating a heater member of a first layer, a heat shield plate of a first layer, and corresponding support columns according to an example embodiment.

FIG. 9D is a front view illustrating a heater member 51-1 of a first layer, a heat shield plate 52-1 of a first layer, and corresponding support columns 55-1 and 56-1 according to an example embodiment. The support columns 55-1 and 56-1 include a base column 55-1 and a connection column 56-1. Redundant illustration is omitted, but in FIG. 9D, a hollow 57-1 is also formed inside the base column 55-1, and a cable for electrical connection with a heat source disposed inside or adjacent to the heater member 51-1 may be accommodated in the hollow 57-1.

However, unlike the base columns 55-1, 55-2, and 55-3 in FIGS. 9B to 9D, since the connection columns 56-1, 56-2, and 56-3 do not require a configuration for cable connection, there is no need to form hollows in the connection columns 56-1, 56-2, and 56-33.

Many modifications and other embodiments of the disclosure will come to the mind of one skilled in the art having the benefit of the teachings presented in the foregoing descriptions and the associated drawings. Therefore, it is understood that the disclosure is not to be limited to the specific embodiments disclosed, and that modifications and embodiments are intended to be included within the scope of the appended claims.

What is claimed is:

1. A thin film deposition apparatus comprising:
- a chamber configured to process a plurality of substrates;
- a plurality of heater members vertically arranged and disposed to correspond to the substrates to heat the substrates, respectively;
- a plurality of lift pins configured to support lower surfaces of the substrates while elevating through the heater members, respectively;
- a plurality of heat shield plates, having a heat shield function between the heater members, on which lower ends of the lift pins are configured to be seated; and
- a plurality of support columns coupled with and supporting the heater members,
- wherein the plurality of support columns comprise a plurality of base columns, each base column integrally connected to a respective heater member of the plurality of heater members and independently extending to a base of the chamber, and
- wherein each base column has a hollow formed in a longitudinal direction, and a cable for supplying power to a respective heat source for heating the respective heater member is accommodated in the hollow.

2. The thin film deposition apparatus of claim 1, wherein the heat shield plates comprise a ceramic material.

3. The thin film deposition apparatus of claim 1, further comprising:
- the base on which the support columns are seated; and
- a driver configured to elevate, lower or rotate the base in the chamber.

4. The thin film deposition apparatus of claim 3, further comprising:
- a plurality of spray ports corresponding to the substrates and formed on a sidewall of the chamber, and configured to supply a process gas to the substrates; and
- a plurality of exhaust ports corresponding to the substrates, and configured to discharge a residual gas remaining after the process gas makes deposition on the substrates.

5. The thin film deposition apparatus of claim 4, wherein when the substrates are loaded on the heater members, the lift pins are configured to be protruded upward from the heater members, and when the substrates are being deposited, the lift pins are configured not to be protruded upward from the heater members.

6. The thin film deposition apparatus of claim 3,
- wherein a heater member among the heater members is supported from the base by a corresponding base column in an end-to-end manner.

7. The thin film deposition apparatus of claim 6, wherein the support columns comprise a connection column, and
- wherein a heater member that is not an uppermost heater member is connected to the uppermost heater member by the connection column.

8. The thin film deposition apparatus of claim 7, wherein a corresponding base column and the connection column are disposed in line with each other.

9. The thin film deposition apparatus of claim 8, wherein a sum of lengths of the corresponding base column and the connection column disposed in line with each other is equal to a sum of lengths of another base column and another connection column regardless of a position occupied by the heater member among the heater members.

10. The thin film deposition apparatus of claim 1, wherein each of the heat shield plates has an area greater than that of a corresponding heater member among the heater members.

11. The thin film deposition apparatus of claim 1, wherein the lift pins formed on the heat shield plates are configured to be synchronously elevated.

12. The thin film deposition apparatus of claim 1, wherein each of the heater members is configured to be controlled to an individual temperature based on temperatures of the heater members.

13. A thin film deposition apparatus comprising:
- a chamber configured to process a plurality of substrates;
- a plurality of heater members disposed to correspond to the substrates to heat the substrates, respectively;
- a plurality of lift pins configured to support lower surfaces of the substrates while elevating through the heater members, respectively;
- a plurality of heat shield plates, having a heat shield function between the heater members, on which lower ends of the lift pins are configured to be seated;
- a plurality of support columns coupled with and supporting the heater members;
- a base on which the support columns are seated; and
- a driver configured to elevate, lower or rotate the base in the chamber,
- wherein the support columns comprise a base column,
- wherein a heater member among the heater members is supported from the base by the base column in an end-to-end manner,
- wherein the support columns comprise a connection column,
- wherein the heater member is not an uppermost heater member, and connected to the uppermost heater member by the connection column,
- wherein the support columns comprise:
  - a same number of base columns as the heater members; and
  - one or more connection columns, of which a number is smaller than the heater members by one (1), and
- wherein the heater member comprises an upper open groove for seating the connection column and a through hole for coupling another connection column connected from another heater member.

14. The thin film deposition apparatus of claim 13, wherein the heater members comprise the uppermost heater member comprising a lower open groove for coupling another connection column connected from another heater member.

15. The thin film deposition apparatus of claim 13, wherein each of a number of the heater members, a number of the heat shield plates, and a number of the support columns is four (4).

16. The thin film deposition apparatus of claim 15, wherein the four support columns are disposed to have a short circumferential distance space and a long circumferential distance space along circumferential directions of the heater members and the heat shield plates.

17. The thin film deposition apparatus of claim 16, wherein the heat shield plates comprise recesses that are concave in an inner radial direction within a predetermined circumferential angle.

18. The thin film deposition apparatus of claim 17, wherein each of the recesses has the predetermined circumferential angle corresponding to the short circumferential distance space.

19. A deposition apparatus comprising:

a chamber configured to process a plurality of substrates;

a plurality of heater members disposed to correspond to the substrates to heat the substrates;

a plurality of heat shield plates between the heater members; and a plurality of support columns coupled to and supporting the heater members, wherein each of the support columns comprises a base column extended downward from a corresponding heater member and a connection column extended upward from the corresponding heater member, and wherein a base column of a support column and a base column of another support column have different vertical lengths, and a connection column of the support column and a connection column of the other support column have different vertical lengths, while a sum of the base column and the connection column of the support column is equal to a sum of the base column and the connection column of the other support column.

20. The deposition apparatus of claim 19, wherein the support columns are disposed to have different circumferential intervals along circumferential directions of the heater members and the heat shield plates.

* * * * *